(12) United States Patent
Zhao et al.

(10) Patent No.: US 9,686,043 B2
(45) Date of Patent: Jun. 20, 2017

(54) TRANSMISSION AND RECEPTION METHODS AND ASSOCIATED COMMUNICATION DEVICES FOR USE IN OFDM-BASED COMMUNICATION NETWORK

(71) Applicant: Telefonaktiebolaget L M Ericsson (publ), Stockholm (SE)

(72) Inventors: Zhenshan Zhao, Beijing (CN); Qianxi Lu, Beijing (CN); Qingyu Miao, Beijing (CN); Stefano Sorrentino, Solna (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 14/892,063

(22) PCT Filed: May 21, 2014

(86) PCT No.: PCT/CN2014/078008
§ 371 (c)(1),
(2) Date: Nov. 18, 2015

(87) PCT Pub. No.: WO2014/187320
PCT Pub. Date: Nov. 27, 2014

(65) Prior Publication Data
US 2016/0119083 A1  Apr. 28, 2016

Related U.S. Application Data

(63) Continuation of application No. PCT/CN2013/081664, filed on Aug. 16, 2013.
(Continued)

(30) Foreign Application Priority Data

Aug. 16, 2013  (WO) ................ PCT/CN2013/081664

(51) Int. Cl.
*H04L 1/00* (2006.01)
*H03M 13/27* (2006.01)
(Continued)

(52) U.S. Cl.
CPC ...... *H04L 1/0068* (2013.01); *H03M 13/2703* (2013.01); *H03M 13/2957* (2013.01);
(Continued)

(58) Field of Classification Search
CPC ... H04L 1/0068; H04L 1/0071; H04L 5/0007; H03M 13/2703; H03M 13/6525; H03M 13/2957
(Continued)

(56) References Cited

U.S. PATENT DOCUMENTS

2007/0121742 A1  5/2007 Tamaki et al.
2008/0310535 A1  12/2008 Kwon et al.
(Continued)

FOREIGN PATENT DOCUMENTS

CN  101223719 A  7/2008
CN  101253704 A  8/2008
(Continued)

OTHER PUBLICATIONS

PCT Notification of Transmittal of the International Search Report and the Written Opinion of the International Searching Authority, or the Declaration for International application No. PCT/CN2014/078008, Aug. 26, 2014.
(Continued)

*Primary Examiner* — Siu Lee
(74) *Attorney, Agent, or Firm* — Baker Botts, LLP

(57) ABSTRACT

The present disclosure provides a terminal device and a method performed in the terminal device for communicating with a radio base station (RBS) or a Device-to-Device (D2D) terminal device. The method comprises forming a
(Continued)

radio subframe by including coded bits in the radio subframe. The coded bits contain a sequence of systematic bits and a sequence of redundancy bits, and only redundancy bits are included in a head and a tail of the first and/or the last Orthogonal Frequency Division Multiplexing (OFDM) symbols of the radio subframe. The method further comprises transmitting the radio subframe to the radio base station RBS or the Device-to-Device (D2D) terminal device. The present disclosure also provides a communication device communicating with the proposed terminal device and a method performed in the communication device.

22 Claims, 10 Drawing Sheets

Related U.S. Application Data

(60) Provisional application No. 61/825,765, filed on May 21, 2013.

(51) Int. Cl.
   *H03M 13/29* (2006.01)
   *H03M 13/00* (2006.01)
   *H03M 13/35* (2006.01)
   *H04W 4/00* (2009.01)
   *H04L 5/00* (2006.01)

(52) U.S. Cl.
   CPC ..... *H03M 13/356* (2013.01); *H03M 13/6525* (2013.01); *H04L 1/0071* (2013.01); *H04L 5/0058* (2013.01); *H04W 4/005* (2013.01); *H04L 5/0007* (2013.01); *H04L 5/0044* (2013.01)

(58) Field of Classification Search
   USPC ................ 375/259, 260, 285, 295, 296, 299
   See application file for complete search history.

(56) References Cited

U.S. PATENT DOCUMENTS

| | | | | |
|---|---|---|---|---|
| 2010/0027704 | A1* | 2/2010 | Ho | H04L 1/0041 375/267 |
| 2014/0161087 | A1* | 6/2014 | Chun | H04L 5/0048 370/329 |
| 2015/0296518 | A1* | 10/2015 | Yi | H04L 5/0048 370/336 |
| 2015/0304080 | A1* | 10/2015 | Yi | H04L 5/0048 370/329 |

FOREIGN PATENT DOCUMENTS

| | | |
|---|---|---|
| CN | 101814972 A | 8/2010 |
| WO | WO 2007/027052 A1 | 3/2007 |
| WO | WO 2008/127054 A1 | 10/2008 |
| WO | WO 2014/189424 A1 | 11/2014 |

OTHER PUBLICATIONS

3GPP TS 36.212 V10.2.0; Technical Specification; 3rd Generation Partnership Project; Technical Specification Group Radio Access Network; Evolved Universal Terrestrial Radio Access (E-UTRA); Multiplexing and channel coding (Release 10), Jun. 2011.
3GPP TS 36.211 V10.2.0; Technical Specification; 3rd Generation Partnership Project; Technical Specification Group Radio Access Network; Evolved Universal Terrestrial Radio Access (E-UTRA); Physical Channels and Modulation (Release 10), Jun. 2011.
EPO Communication with extended European search report, Application No. 14801630.6-1906/3000199 PCT/CN2014078008, 9 pages, Dec. 15, 2016.

* cited by examiner

TRANSMISSION AND RECEPTION METHODS AND ASSOCIATED COMMUNICATION DEVICES FOR USE IN OFDM-BASED COMMUNICATION NETWORK

CROSS-REFERENCE TO RELATED APPLICATIONS

This nonprovisional application is a U.S. National Stage Filing under 35 U.S.C. §371 of International Patent Application Serial No. PCT/CN2014/078008, filed May 21, 2014, and entitled "Transmission and Reception Methods and Associated Communication Devices for Use in OFDM-Based Communication Network" which claims priority to International Patent Application Serial No. PCT/CN2013/081664 filed Aug. 16, 2013, which claims priority to U.S. Provisional Patent Application No. 61/825,765 filed May 21, 2013, all of which are hereby incorporated by reference in their entirety.

TECHNICAL FIELD

The present disclosure generally relates to the technical field of wireless communication systems, and particularly, to a transmission method and a reception method for use in an Orthogonal Frequency Division Multiplexing (OFDM) based radio communication network, and associated communication devices.

BACKGROUND

This section is intended to provide a background to the various embodiments of the technology described in this disclosure. The description in this section may include concepts that could be pursued, but are not necessarily ones that have been previously conceived or pursued. Therefore, unless otherwise indicated herein, what is described in this section is not prior art to the description and/or claims of this disclosure and is not admitted to be prior art by the mere inclusion in this section.

Recent developments of the $3^{rd}$ Generation Partnership Project (3GPP) Long Term Evolution (LTE) aim to facilitate accessing local IP-based services in various places, such as at home, office, or public hot spots, or even in outdoor environments. One of the important use cases for the local IP access and local connectivity involves a so-called device-to-device (D2D) communication mode, wherein user equipments (UEs) in close proximity to each other perform a direct communication. This direct communication is typically over a distance of less than a few tens of meters, but may sometimes extend to hundreds of meters.

Because D2D UEs are much closer to each other than cellular UEs that have to communicate via at least one cellular access point (e.g., an eNB), the D2D communication enables a number of potential gains over the traditional cellular technique, including capacity gain, peak rate gain, and latency gain.

The capacity gain may be achieved, for example, by reusing radio resources (e.g., OFDM resource blocks) between D2D and cellular communications and by reducing the number of links between UEs from two to one and accordingly reducing the radio resources required for one link. The peak rate gain directly results from the relatively short distance between D2D UEs and the potentially favorable propagation condition there between. The latency gain is also a direct result of the single relatively short link between D2D UEs.

FIG. 1 illustrates an example of a mixed cellular and D2D network, wherein UE 101 is a cellular UE which communicates via an eNB 110, whereas UEs 102 and 103 are D2D UEs which communicate with each other directly. In such a mixed cellular and D2D network, D2D communications share radio resources with cellular uplink (UL) communications.

In the LTE context, it has been further proposed that the D2D data communications should use the same coding and modulation techniques as used by devices in communicating with the cellular network in uplink. The details about coding and modulation for LTE uplink communication are given by existing 3GPP standards, e.g., in the 3GPP documents "Multiplexing and Channel Coding", 3GPP TS 36.212, v 10.2.0 (June 2011) and "Physical Channels and Modulation", 3GPP TS 36.211, v 10.2.0 (June 2011), available at http://www.3gpp.org.

According to 3GPP TS 36.212, in the case of data coding, a rate-1/3 turbo encoder shall be used. The output of the turbo encoder consists of three streams, corresponding to one systematic bit and two parity bit streams (referred to as the "Systematic", "Parity 1", and "Parity 2" streams in the following), respectively, as well as 12 tail bits, due to trellis termination. Parity bits included in the two parity bit streams are collectively referred to as redundancy bits.

After being subjected to circular buffer rate matching (CBRM) and channel interleaving, the coded bits (including the systematic bits and the redundancy bits) go through processes, such as scrambling, modulation, layer mapping, precoding, Discrete-Fourier Transform (DFT) precoding, resource mapping and Single-Carrier Frequency-Division Multiple Access (SC-FDMA, sometimes called SC-OFDM) signal generation by Inverse Fast-Fourier-Transform (IFFT) operation, which are specified in 3GPP TS 36.211.

It can be shown that SC-OFDM is a time-domain modulation. That is, for a given SC-OFDM symbol, the first output time-domain samples contain energy mostly from the first "modulated symbols", the last output time-domain samples contain energy mostly from the last "modulated symbols", and the middle output time-domain samples contain energy mostly from the middle "modulated symbols". Note the difference with OFDM where each modulated symbol occupies only one subcarrier, which in turn implies that each modulated symbol spans evenly all output time-domain samples.

Time-Division Duplexing (TDD) will be used as the duplex scheme of D2D communication, which means that the cellular uplink resources are allocated to up/downstream directions of each D2D pair in a time-division multiplexing (TDM) manner. D2D devices (D2D UEs) are assumed to be half-duplex on the uplink resources during D2D communications.

On the resources used for these communications (called "UL resources" hereinafter), there are three kinds of subframes: cellular uplink subframes, D2D transmit (TX) subframes, and D2D receive (RX) subframes. These subframes can occur in several orders—thus, there will be different subframe transitions among these subframe transmissions, and there will be possible collisions at the beginning/end of subframes, in some cases causing interference to the beginning or ending portions of subframes. In many cases, these possible collisions are caused by the intentional differences in timing between UE transmissions and base station frame timing, known as timing advance (TA), and the corresponding timing advance needed for D2D communications, which may differ.

A few of these collision/interference scenarios are detailed below. It should be appreciated that there may be more. FIG. 2 illustrates an intra-UE interference scenario, e.g., where timing differences in a D2D transmission result in that a received D2D subframe at D2D UE2, labelled "D2D (rx)," collides with D2D UE2's attempt to transmit an uplink subframe to the cellular base station (eNB). As can be seen in the figure, the end portion of the received D2D subframe overlaps with the uplink cellular subframe at D2D UE2. Note that the part of the figure labeled "Only this part relevant for FDD" includes only uplink and D2D subframes. (The D2D subframes are marked "CS" at the eNB—this indicates that these are "combined subframes," i.e., subframes that may contain D2D and/or cellular transmissions.) This part of the figure does not include any downlink or special subframes, which are present only if the eNB is operating in Time-Division Duplexing (TDD) operating mode. Thus it will be appreciated that the techniques described herein may be applied when the cellular system is operating in TDD mode or in Frequency-Division Duplexing (FDD) mode.

An assumption here is that the timing advance (TA) of D2D transmission uses the same TA as cellular. Because of different TA of D2D TX/D2D RX, propagation delay from D2D TX to RX and the ON/OFF transient period from D2D Rx to cellular Tx, there will be collision at the subframe transition from D2D RX to cellular UL.

FIG. 3 illustrates an inter-UE interference scenario, where reception of a D2D subframe (labeled "RX") at D2D Rx is interfered by an uplink transmission by a nearby UE ("Cellular UE"). "C-SF" in this Figure indicates a combined subframe, which is a subframe that may contain D2D and/or cellular transmissions.

Again, because of different TA between the D2D TX and the cellular systems, and the propagation delay to D2D RX, the cellular UE will interfere with the D2D RX at the beginning of the D2D subframe. The figure shows a 2-microsecond interference, which corresponds to a 300-meter distance between the cellular UE and the D2D RX. If the distance is larger, such as 900 meters, corresponding to 6 microseconds of interference, then the interference cannot be handled by normal cyclic prefix and interference may also occur at the beginning of D2D subframe.

One proposed approach to address the possible interference discussed above is to modify the subframe used for D2D communications to include a guard period (GP) at the beginning and/or the end of the frame. For instance, to avoid the interference at the beginning and/or end of the D2D subframe, an OFDM symbol is reserved at the beginning and/or end of the D2D subframe. An LTE OFDM symbol corresponds to 70 us, which is large enough to avoid the inter-/intra-UE interference.

There are some remaining problems with this approach. For example, although it is a simple solution, a full blank symbol may cause an unnecessary resource waste. In practical D2D scenarios, the maximum distance between D2D TX and RX is only several kilometers, which correspond to several microseconds. The GP needed to accommodate potential collisions is on the same order. An OFDM symbol, on the other hand, is about 70 us. If an entire OFDM is reserved for the GP, it will cause great resource waste.

SUMMARY

An object of the present disclosure is to provide solutions for alleviating the adverse impact of the possible inter-/intra-UE interference in a resource-efficient manner.

According to a first aspect of the present disclosure, there are provided a terminal device and a method performed in the terminal device for communicating with a radio base station (RBS) or a D2D terminal device in an OFDM based radio communication network.

The terminal device comprises a subframe former and a transceiver. The subframe former is configured to form a radio subframe by including coded bits in the radio subframe. The coded bits contain a sequence of systematic bits and a sequence of redundancy bits. Only redundancy bits are included in a head and a tail of the first and/or the last OFDM symbols of the radio subframe. The transceiver is configured to transmit the radio subframe to the RBS or the D2D terminal device.

The method comprises forming a radio subframe by including coded bits in the radio subframe. The coded bits contain a sequence of systematic bits and a sequence of redundancy bits. Only redundancy bits are included in a head and a tail of the first and/or the last OFDM symbols of the radio subframe. The method also comprises transmitting the radio subframe to the RBS or the D2D terminal device.

Since only redundancy bits are included in the head and the tail of the first OFDM symbol of a radio subframe, systematic bits do not suffer from inter-UE interference occurring at the head of the first OFDM symbol and are not affected by interference leaking to the tail of the first OFDM symbol. Since only redundancy bits are included in the head and the tail of the last OFDM symbol of a radio subframe, systematic bits do not suffer from intra-UE interference occurring at the tail of the last OFDM symbol and are not affected by interference leaking to the head of the last OFDM symbol. As a result, it is highly likely to successfully demodulate and decode a radio subframe, because systematic bits would not be affected by intra-/inter-UE interference directly or indirectly even if the radio subframe is subject to the intra-/inter-UE interference. Moreover, as no GP is reserved at the beginning and/or the end of the subframe, the resource efficiency is improved.

According to a second aspect of the present disclosure, there are provided a communication device communicating with the terminal device according to the first aspect of the disclosure and a method performed in the communication device.

The communication device comprises a transceiver and a puncturing component. The transceiver is configured to receive a radio subframe from a cellular terminal device or a D2D terminal device. The radio subframe carries redundancy bits in a head and a tail of the first and/or the last OFDM symbols of the radio subframe. The puncturing component is configured to puncture bits in the radio subframe which correspond to the head and the tail of at least one of the first and the last OFDM symbols, wherein the at least one of the first and the last OFDM symbols is subject to interference.

The method comprises receiving a radio subframe from the cellular terminal device or the D2D terminal device. The radio subframe carries redundancy bits in a head and a tail of the first and/or the last OFDM symbols of the radio subframe. The method also comprises puncturing bits in the radio subframe which correspond to the head and the tail of at least one of the first and the last OFDM symbols, wherein the at least one of the first and the last OFDM symbols is subject to interference.

By puncturing the bits in the radio subframe which correspond to the head and the tail of the interfered OFDM symbol(s), the intra-/inter-UE interference can be removed. Thereby, it is possible to successfully demodulate and decode the radio subframe.

According to a third aspect of the present disclosure, there is provided a terminal device for communicating with a radio base station (RBS) or a D2D terminal device in an OFDM based radio communication network. The terminal device comprises a transceiver, a memory and a processor. The memory has machine-readable program code stored therein. The processor executes the stored program code to form a radio subframe by including coded bits in the radio subframe, wherein the coded bits contain a sequence of systematic bits and a sequence of redundancy bits, and only redundancy bits are included in a head and a tail of the first and/or the last OFDM symbols of the radio subframe. The transceiver transmits the formed radio subframe to the RBS or the D2D terminal device.

According to a fourth aspect of the present disclosure, there is provided a communication device communicating with the terminal device according to the first or third aspect of the disclosure. The communication device comprises a transceiver, a memory and a processor. The transceiver receives a radio subframe from a cellular terminal device or a D2D terminal device, wherein the radio subframe carries redundancy bits in a head and a tail of the first and/or the last OFDM symbols of the radio subframe. The memory has machine-readable program code stored therein. The processor executes the stored program code to puncture bits in the radio subframe which correspond to the head and the tail of at least one of the first and the last OFDM symbols, wherein the at least one of the first and the last OFDM symbols is subject to interference.

According to a fifth aspect of the present disclosure, there is provided a terminal device for communicating with a radio base station (RBS) or a D2D terminal device in an OFDM based radio communication network. The terminal device comprises means adapted to form a radio subframe by including coded bits in the radio subframe and to transmit the radio subframe to the RBS or the D2D terminal device. The coded bits contain a sequence of systematic bits and a sequence of redundancy bits. Only redundancy bits are included in a head and a tail of the first and/or the last OFDM symbols of the radio subframe.

According to a sixth aspect of the present disclosure, there is provided a communication device communicating with the terminal device according to the first, third or fifth aspect of the disclosure. The communication device comprises means adapted to receive a radio subframe from the cellular terminal device or the D2D terminal device and to puncture bits in the radio subframe which correspond to the head and the tail of at least one of the first and the last OFDM symbols, wherein the at least one of the first and the last OFDM symbols is subject to interference. The radio subframe carries redundancy bits in a head and a tail of the first and/or the last OFDM symbols of the radio subframe.

As explicitly indicated, the present disclosure is applicable to not only D2D communications between D2D terminal devices but also cellular communications between a cellular terminal device and an RBS. In the latter case, a radio subframe transmitted by the cellular terminal device may suffer from any kind of interference at a head of the first OFDM symbol of the subframe and/or any kind of interference at a tail of the last OFDM symbol of the subframe.

BRIEF DESCRIPTION OF THE DRAWINGS

The above and other objects, features, and advantages of the present disclosure will become apparent from the following descriptions on embodiments of the present disclosure with reference to the drawings, in which.

DETAILED DESCRIPTION OF EMBODIMENTS

Figure 1:
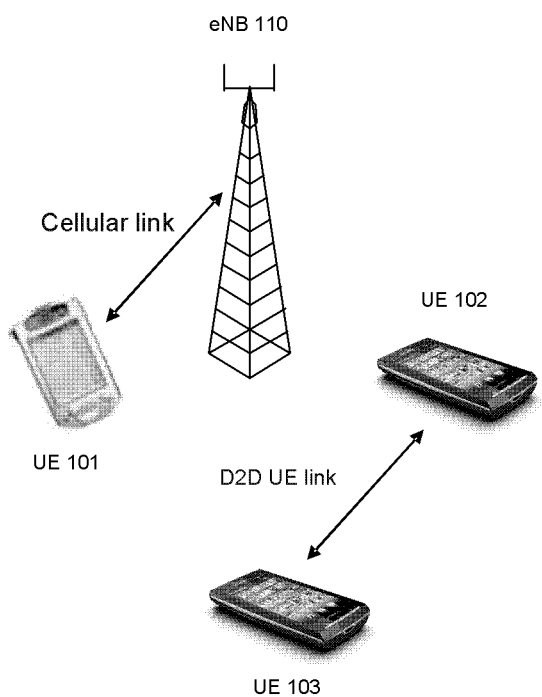
FIG. 1 is a diagram illustrating a mixed cellular and D2D network.
Figure 2:
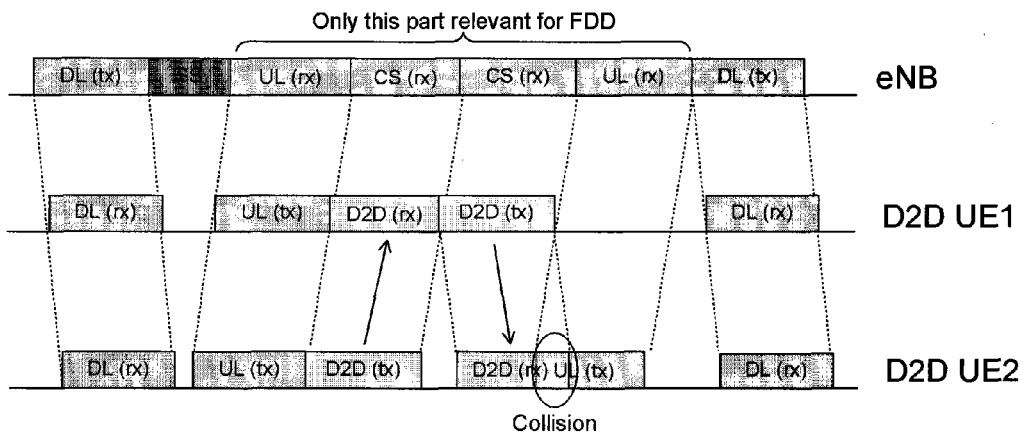
FIG. 2 is a diagram illustrating an intra-UE interference scenario occurring in the mixed cellular and D2D network.
Figure 3:
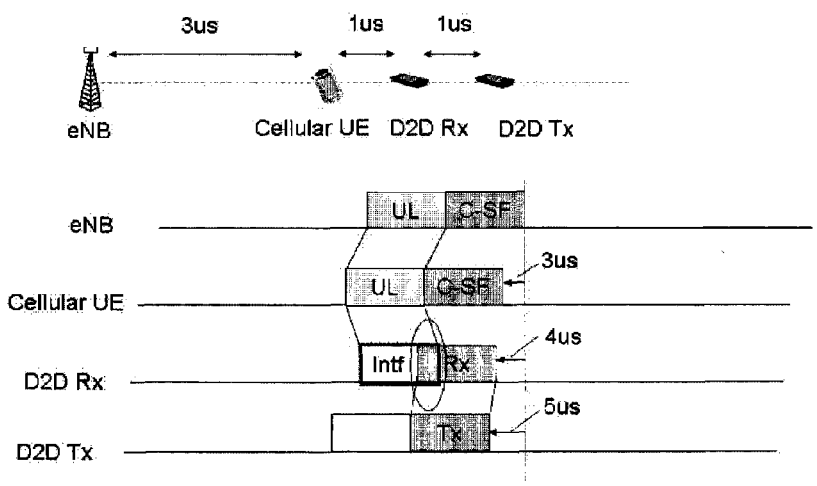
FIG. 3 is a diagram illustrating an inter-UE interference scenario occurring in the mixed cellular and D2D network.

In the discussion that follows, specific details of particular embodiments of the present techniques are set forth for purposes of explanation and not limitation. It will be appreciated by those skilled in the art that other embodiments may be employed apart from these specific details. Furthermore, in some instances detailed descriptions of well-known methods, nodes, interfaces, circuits, and devices are omitted so as not to obscure the description with unnecessary detail. Those skilled in the art will appreciate that the functions described may be implemented in one or in several nodes. Some or all of the functions described may be implemented using hardware circuitry, such as analog and/or discrete logic gates interconnected to perform a specialized function, ASICs, PLAs, etc. Likewise, some or all of the functions may be implemented using software programs and data in conjunction with one or more digital microprocessors or general purpose computers. Where nodes that communicate using the air interface are described, it will be appreciated that those nodes also have suitable radio communications circuitry. Moreover, the technology can additionally be considered to be embodied entirely within any form of computer-readable memory, including non-transitory embodiments such as solid-state memory, magnetic disk, or optical disk containing an appropriate set of computer instructions that would cause a processor to carry out the techniques described herein.

Hardware implementations of the presently disclosed techniques may include or encompass, without limitation, digital signal processor (DSP) hardware, a reduced instruction set processor, hardware (e.g., digital or analog) circuitry including but not limited to application specific integrated circuit(s) (ASIC) and/or field programmable gate array(s) (FPGA(s)), and (where appropriate) state machines capable of performing such functions.

In terms of computer implementation, a computer is generally understood to comprise one or more processors or one or more controllers, and the terms computer, processor, and controller may be employed interchangeably. When provided by a computer, processor, or controller, the functions may be provided by a single dedicated computer or processor or controller, by a single shared computer or processor or controller, or by a plurality of individual computers or processors or controllers, some of which may be shared or distributed. Moreover, the term "processor" or "controller" also refers to other hardware capable of performing such functions and/or executing software, such as the example hardware recited above.

Note that although terminology commonly used to describe LTE technology, as standardized by the 3GPP, is used in this disclosure to exemplify the embodiments, this should not be seen as limiting the scope of the techniques to only the aforementioned system. Other wireless systems may also benefit from exploiting the ideas covered within this disclosure. Thus, terms like "eNodeB" and "UE" as used herein should be understood to refer more broadly to radio base stations (or radio access nodes) and terminal devices, respectively, where "terminal device" should be understood to encompass not only end-user wireless devices designed to be used by human beings for wirelessly communicating voice and/or data (such as mobile telephones, smartphones, wireless-enabled tablets or personal computers, and the like) but also end-application wireless devices enabled to wirelessly communicate data without human involvement (such as wireless machine-to-machine units, and the like). Similarly, while specific channels described in 3GPP standards are referred to herein, the disclosed techniques should be understood as applicable to similar channels in other wireless systems.

Figure 4:
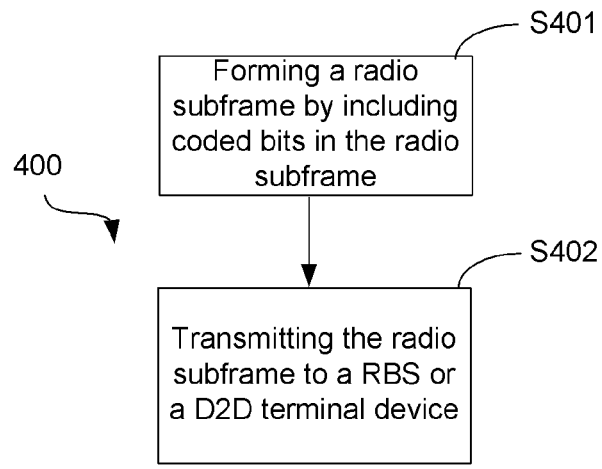
FIG. 4 is a flowchart illustrating a method performed in a terminal device at the transmission side according to an example of the present disclosure.

FIG. 4 schematically illustrates a method 400 performed in a terminal device at the transmission side according to an example of the present disclosure. As set forth above, the terminal device may be a cellular terminal device participating in cellular communications or a D2D terminal device participating in D2D communications.

As illustrated, initially, a radio subframe is formed by including coded bits in the radio subframe at block S401. The coded bits contain a sequence of systematic bits and a sequence of redundancy bits, and only redundancy bits are included in a head and a tail of the first and/or the last OFDM symbols of the radio subframe. After block S401, the radio subframe is transmitted at S402 by the terminal device to an RBS or a D2D terminal device.

According to the proposed method, inclusion of systematic bits in the head of the first OFDM symbol and/or the tail of the last OFDM symbol of the radio subframe is avoided. Therefore, systematic bits do not suffer from interference occurring at the head of the first OFDM symbol and/or the tail of the last OFDM symbol of the radio subframe.

Furthermore, taking into account leakage of interference caused by a windowing operation performed in frequency domain at the reception side for selecting resource blocks allocated to the transmitting terminal device, the tail of the first OFDM symbol and/or the head of the last OFDM symbol of the radio subframe do not include systematic bits, either. Therefore, systematic bits are not affected by interference leaking from the head of the first OFDM symbol to the tail of the first OFDM symbol and/or leaking from the tail of the last OFDM symbol to the head of the last OFDM symbol.

Accordingly, by means of the proposed method, it is highly likely to successfully demodulate and decode a radio subframe, because systematic bits would not be affected by interference at a head of the first OFDM symbol and/or a tail of the last OFDM symbol of the radio subframe directly or indirectly.

According to an example, if systematic bits are to be included in the first and/or last OFDM symbol, the systematic bits can be included in a central portion of the first and/or the last OFDM symbol. As such, even if a radio subframe is subject to interference at a head of the first OFDM symbol and/or a tail of the last OFDM symbol of a radio subframe, systematic bits would not be affected by the interference directly or indirectly.

Figure 5:
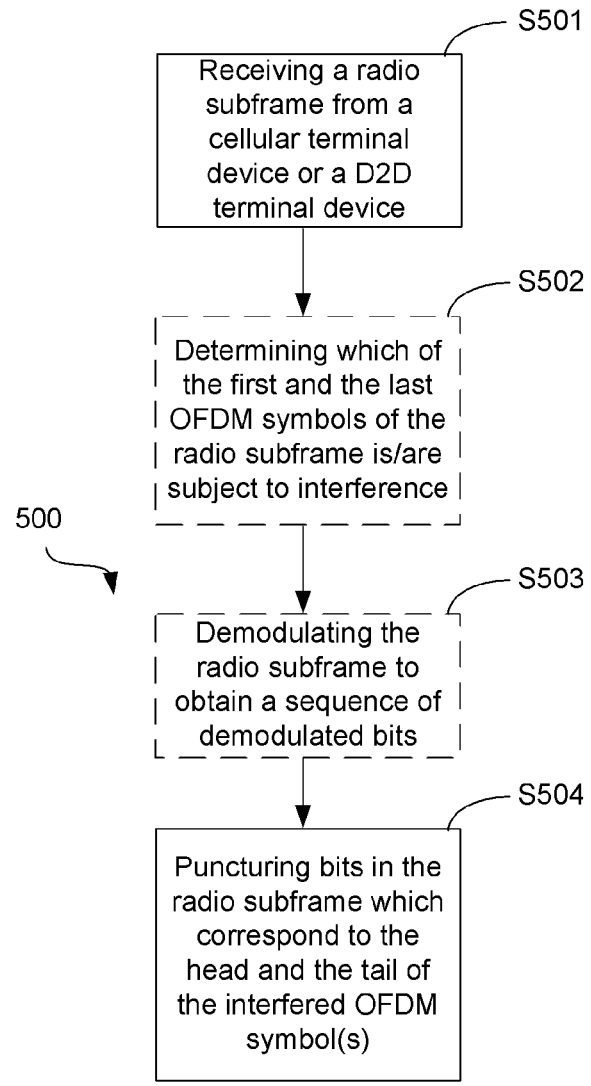
FIG. 5 is a flowchart illustrating a method performed in a communication device at the reception side according to an example of the present disclosure.

FIG. 5 schematically illustrates a method 500 performed in a communication device at the reception side according to an example of the present disclosure. Correspondingly to the above-described method 400, the communication device at the reception side may be an RBS or a D2D terminal device.

As illustrated, initially, a radio subframe is received from a cellular terminal device or a D2D terminal device at block S501. In correspondence with the above-described method 400, the radio subframe carries redundancy bits in a head and a tail of the first and/or the last OFDM symbols of the radio subframe. In case at least one of the first and the last OFDM symbols is subject to interference, bits in the radio subframe which correspond to the head and the tail of the interfered OFDM symbol(s) are punctured at block S504.

Optionally, after block S501, it is determined which of the first and the last OFDM symbols of the radio subframe is/are subject to interference, as shown at block S502.

As well known in the art, in order to obtain the bits in the received radio subframe, the radio subframe shall be subject to inverse operations of the processes performed at the transmission side, i.e., at the cellular terminal device or the D2D terminal device from which the radio subframe is received. The processes, as set forth in the background, may include coding, CBRM, channel interleaving, scrambling, modulation, layer mapping, precoding, DFT precoding, resource mapping and IFFT, all of which as well as their inverse operations are commonly used signal processing operations in the art. According to an example, demodulation can be applied to the received radio subframe to obtain a sequence of demodulated bits, as illustrated in FIG. 5 at block S503. Accordingly, some of the demodulated bits which correspond to the head and the tail of the interfered OFDM symbol(s) can be punctured at block S504.

In an embodiment, a length of an interfered part of the interfered OFDM symbol(s) can be determined, and bits in the radio subframe which correspond to the interfered part of the interfered OFDM symbol(s) can be punctured.

The inclusion of redundancy bits in the head and tail of the first and/or the last OFDM symbol of a radio subframe may be achieved by simply modifying the conventional channel interleaving manner. To illustrate this, the conventional and the modified channel interleaving manners are presented in FIGS. 6 and 7, respectively.

Figure 6:
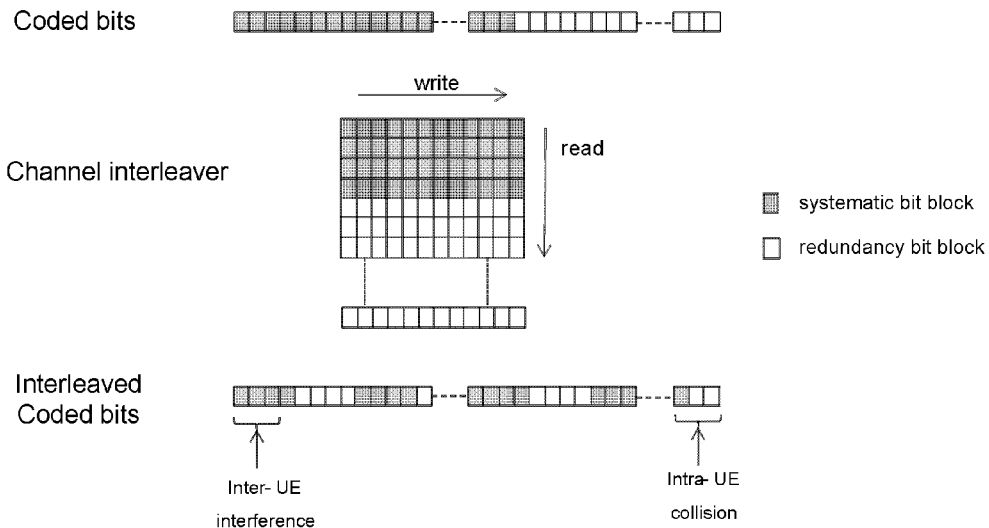
FIG. 6 is a diagram illustrating channel interleaving of coded bits according to the prior art.

As shown in FIG. 6, according to the conventional channel interleaving, coded bits, including a sequence of systematic bits and a sequence of redundancy bits, are firstly written into an interleaving matrix row-by-row.

Next, the coded bits are read out from the interleaving matrix column-by-column, so that a sequence of interleaved coded bits can be obtained. In the interleaving matrix, each column corresponds to an OFDM symbol. Therefore, being read out first, the leftmost column of the interleaving matrix corresponds to the first OFDM symbol of a subframe. Likewise, the rightmost column of the interleaving matrix corresponds to the last OFDM symbol of the subframe.

In the interleaving process, the coded bits are written and read by blocks, with each block of coded bits corresponds to a modulated symbol. For example, if the modulation scheme is Quadrature Phase Shift Keying (QPSK), each block contains two coded bits.

After being interleaved, the coded bits go through the SC-OFDM signal generation process, which can be regarded as a time-domain modulation as set forth above. In this regard, the coded bits from the top end to the bottom end of a column of the interleaving matrix are basically mapped to time-domain samples from the head to the tail of a corresponding OFDM symbol in sequence.

Since some systematic bits are located at the head of the sequence of interleaved coded bits as illustrated in FIG. 6, they will suffer from interference occurring at the head of the first OFDM symbol of a subframe (e.g., inter-UE interference). Likewise, the systematic bits located at the tail of the sequence of interleaved coded bits will suffer from interference occurring at the tail of the last OFDM symbol of the subframe.

Figure 7:
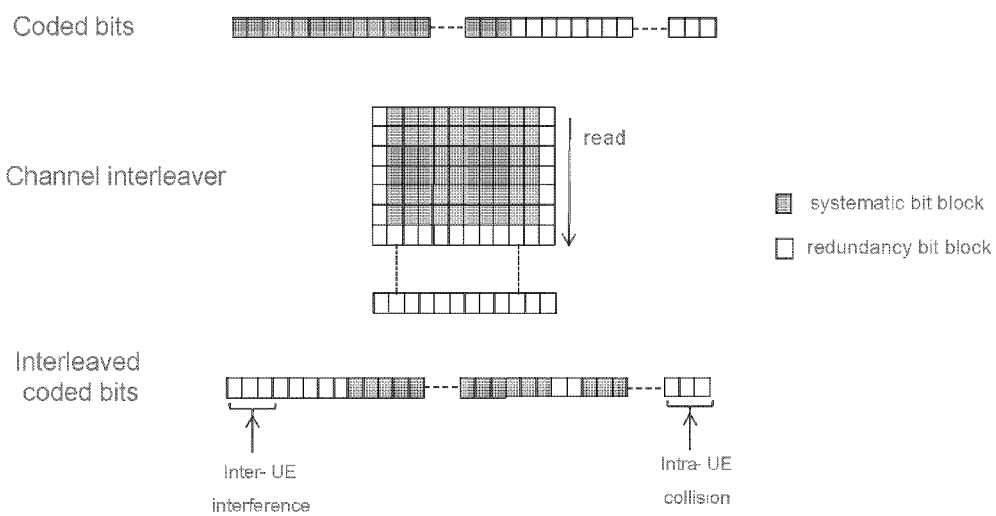
FIG. 7 is a diagram illustrating channel interleaving of coded bits according to an example of the present disclosure.

In contrast with the conventional interleaving manner, in an example interleaving manner according to the present disclosure, only redundancy bits are placed in the leftmost and rightmost columns of the interleaving matrix as illustrated in FIG. 7. After being read out from the interleaving matrix column-by-column, no systematic bit is present at the head and the tail of the sequence of interleaved code bits. Therefore, no systematic bit suffers from interference occurring at the head of the first OFDM symbol and the tail of the last OFDM symbol. Furthermore, as systematic bits are not mapped to the tail of the first OFDM symbol and the head of the last OFDM symbol, they will not affected by leaked interference.

According to an example of the present disclosure, if systematic bits are to be included in the first and/or the last OFDM symbols of a subframe, they can be placed in the central portion of the first and/or the last column of the interleaving matrix. According to another example, the redundancy bits included in the head and the tail of the first and/or the last OFDM symbols belong to a subsequence of the sequence of redundancy bits.

In the following, several specific non-limiting interleaving schemes for mapping a subsequence of the redundancy bits to the first and/or the last OFDM symbol of a subframe will be presented with reference to FIGS. 8-14.

According to a first embodiment, blocks of redundancy bits at a head portion of the subsequence can be placed into blocks of elements at a bottom end portion of the first column of the interleaving matrix and/or a top end portion of the last column of the interleaving matrix. Blocks of redundancy bits at a tail portion of the subsequence can be placed into blocks of elements at a top end portion of the first column of the interleaving matrix and/or a bottom end portion of the last column of the interleaving matrix.

Figure 8:
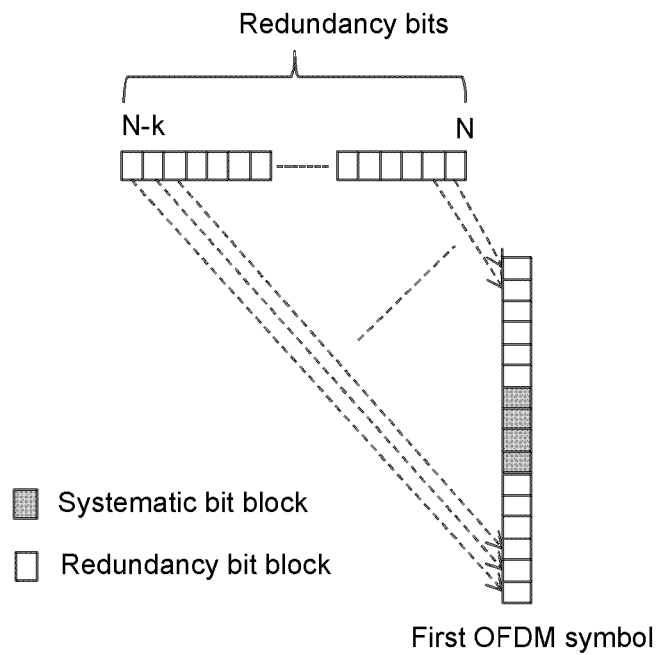
FIG. 8 is a diagram illustrating an interleaving manner for mapping redundancy bits to the first OFDM symbol of a radio subframe according to a first embodiment of the present disclosure.

FIG. 8 illustrates a specific scenario of the first embodiment, where blocks of redundancy bits at a head portion of the subsequence are placed into blocks of elements at a bottom end portion of the first column of the interleaving matrix, and blocks of redundancy bits at a tail portion of the subsequence are placed into blocks of elements at a top end portion of the first column of the interleaving matrix.

This scenario is applicable to the case where only the head of the first OFDM symbol is subject to interference. As will be appreciated by those skilled in the art, the relationship between the blocks of redundancy bits in the subsequence and the blocks of elements in the first column is not limited to the specific correspondence illustrated in FIG. 8. For example, instead of placing the first three blocks of redundancy bits correspondingly into the first three elements from the bottom of the first column, the first three blocks of redundancy bits may be placed into any three blocks of elements at a bottom end portion of the first column in an arbitrary order.

Figure 9:
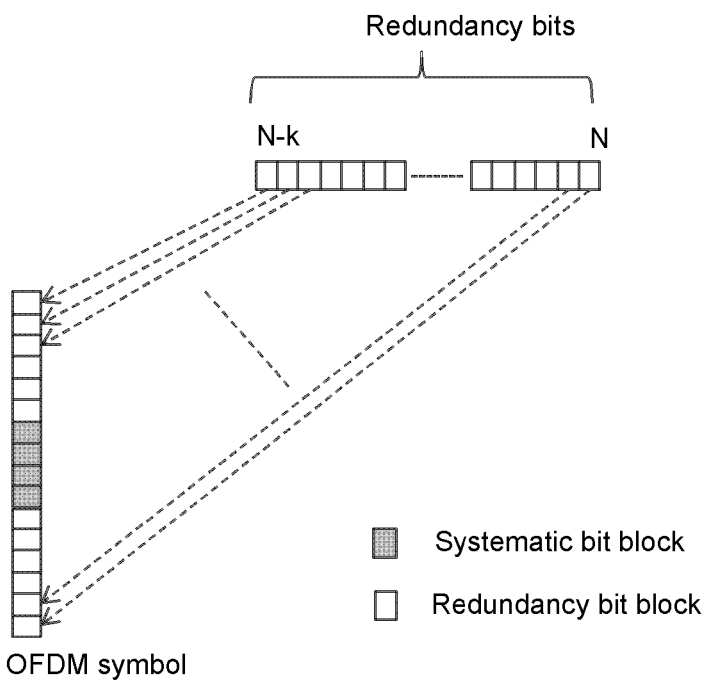
FIG. 9 is a diagram illustrating an interleaving manner for mapping redundancy bits to the last OFDM symbol of a radio subframe according to the first embodiment of the present disclosure.

FIG. 9 illustrates another specific scenario of the first embodiment, where blocks of redundancy bits at a head portion of the subsequence are placed into blocks of elements at a top end portion of the last column of the interleaving matrix, and blocks of redundancy bits at a tail portion of the subsequence are placed into blocks of elements at a bottom end portion of the last column of the interleaving matrix.

This scenario is applicable to the case where only the tail of the last OFDM symbol is subject to interference. Also, as will be appreciated by those skilled in the art, the relationship between the blocks of redundancy bits in the subsequence and the blocks of elements in the last column is not limited to the specific correspondence illustrated in FIG. 9.

Figure 10:
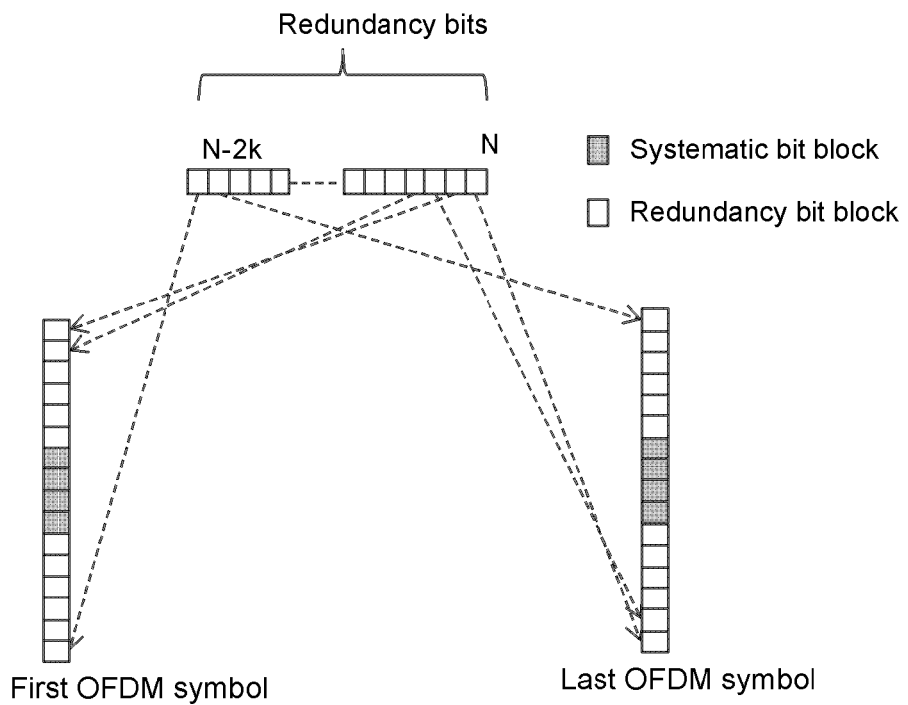
FIG. 10 is a diagram illustrating an interleaving manner for mapping redundancy bits to the first and the last OFDM symbols of a radio subframe according to the first embodiment of the present disclosure.

FIG. 10 illustrates a further specific scenario of the first embodiment, where blocks of redundancy bits at a head portion of the subsequence are placed into blocks of elements at a bottom end portion of the first column of the interleaving matrix and a top end portion of the last column of the interleaving matrix, and blocks of redundancy bits at a tail portion of the subsequence are placed into blocks of elements at a top end portion of the first column of the interleaving matrix and a bottom end portion of the last column of the interleaving matrix.

This scenario is applicable to the case where both the head of the first OFDM symbol and the tail of the last OFDM symbol are subject to interference.

As can be further seen from FIG. 10, any two adjacent blocks of redundancy bits in the subsequence are placed in the first and the last column, respectively. In this manner, the sparsity of the mapping of redundancy bits to the first and last symbols is maximized. For certain codes, decoding performance may benefit from the maximized sparsity.

Note that the first embodiment described above is also applicable when no systematic bits are placed into elements at the central portion of the first and/or the last OFDM symbol, although systematic bits are shown in FIGS. 8-10.

According to a second embodiment, in a case where systematic bits are included in the central portion of the first and/or last OFDM symbol, blocks of redundancy bits at a head portion of the subsequence can be placed into blocks of elements in a neighborhood of the central portion of the first column of the interleaving matrix and/or a neighborhood of the central portion of the last column of the interleaving matrix, and blocks of redundancy bits at a tail portion of the subsequence can be placed into elements at both end portions of the first column of the interleaving matrix and/or both end portions of the last column of the interleaving matrix.

Figure 11:
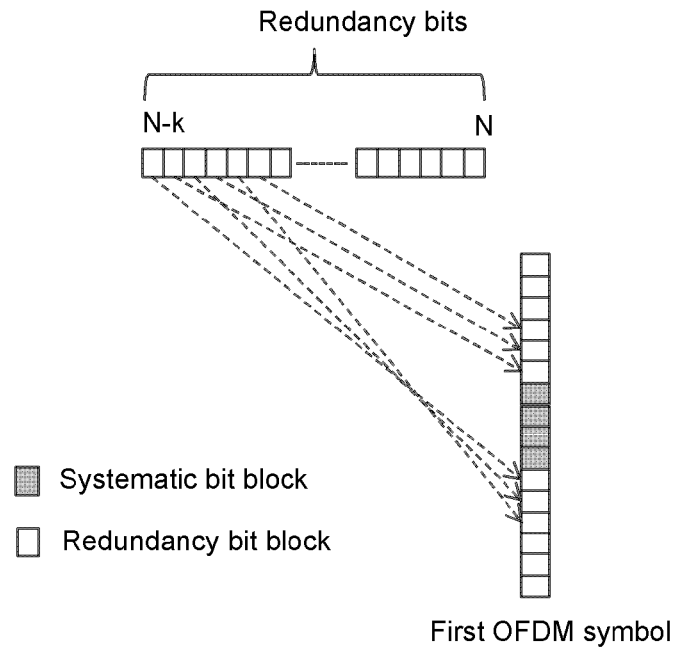
FIG. 11 is a diagram illustrating an interleaving manner for mapping redundancy bits to the first OFDM symbol of a radio subframe according to a second embodiment of the present disclosure.

FIG. 11 illustrates a specific scenario of the second embodiment, where blocks of redundancy bits at a head portion of the subsequence are placed into blocks of elements in a neighborhood of the central portion of the first column of the interleaving matrix, and blocks of redundancy bits at a tail portion of the subsequence are placed into elements at both end portions of the first column of the interleaving matrix.

This scenario is applicable to the case where only the head of the first OFDM symbol is subject to interference. Also, as will be appreciated by those skilled in the art, the relationship between the blocks of redundancy bits in the subsequence and the blocks of elements in the first column is not limited to the specific correspondence illustrated in FIG. 11.

Since blocks of redundancy bits at the tail portion of the subsequence are placed into elements at both end portions of the first column mapped to the first OFDM symbol of a subframe, the interference occurring at the head of the first OFDM symbol as well as the interference leaking from the head to the tail of the first OFMD symbol can be removed by simply puncturing the tail portion of the corresponding subsequence of deinterleaved bits at the reception side.

Figure 12:
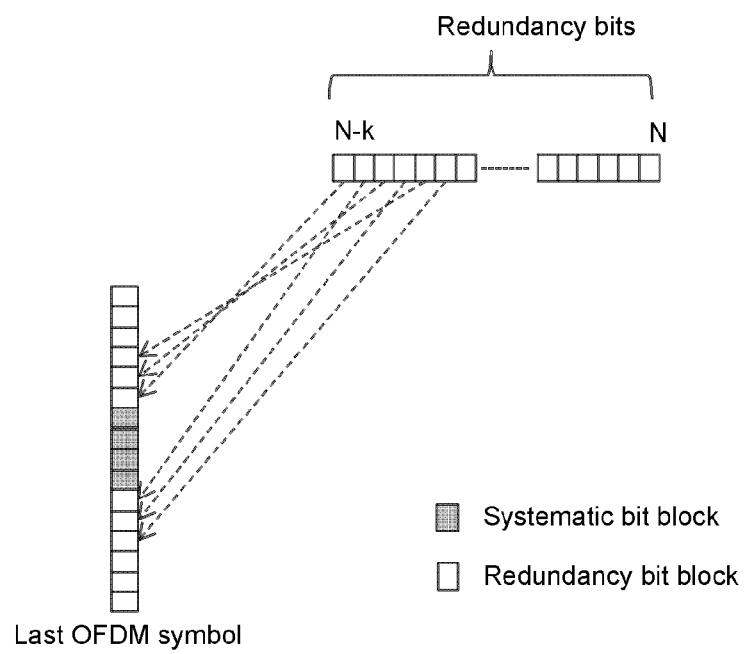
FIG. 12 is a diagram illustrating an interleaving manner for mapping redundancy bits to the last OFDM symbol of a radio subframe according to the second embodiment of the present disclosure.

FIG. 12 illustrates another specific scenario of the second embodiment, where blocks of redundancy bits at a head portion of the subsequence are placed into blocks of elements in a neighborhood of the central portion of the last column of the interleaving matrix, and blocks of redundancy bits at a tail portion of the subsequence are placed into elements at both end portions of the last column of the interleaving matrix. This scenario is applicable to the case where only the tail of the last OFDM symbol is subject to interference.

Figure 13:
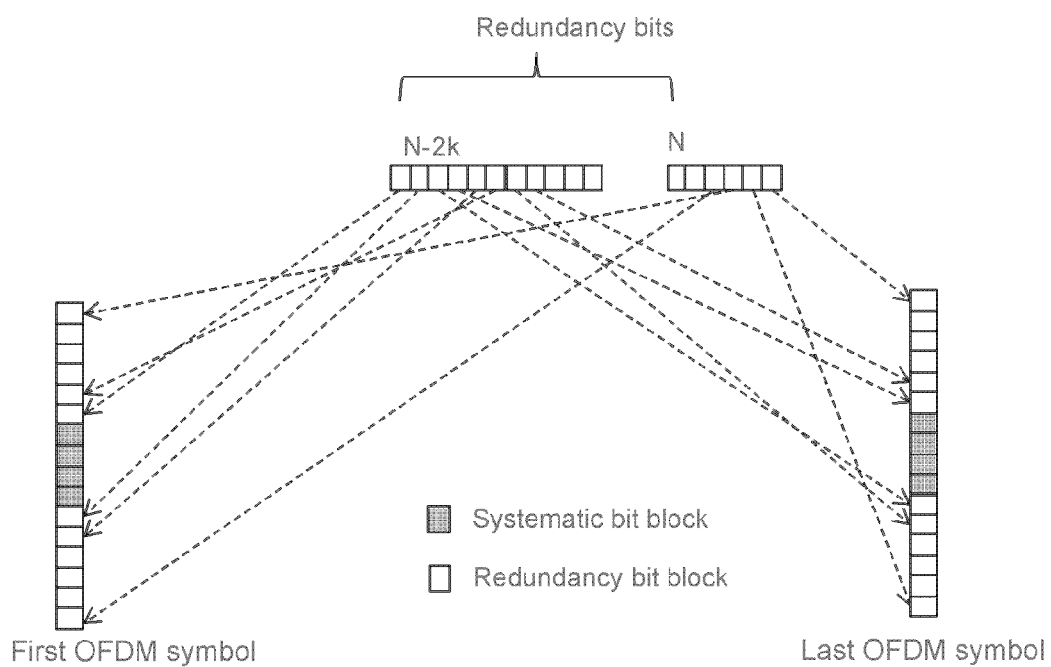
FIG. 13 is a diagram illustrating an interleaving manner for mapping redundancy bits to the first and the last OFDM symbols of a radio subframe according to the second embodiment of the present disclosure.

FIG. 13 illustrates a further specific scenario of the second embodiment, where blocks of redundancy bits at a head portion of the subsequence are placed into blocks of elements in a neighborhood of the central portion of the first column of the interleaving matrix and a neighborhood of the central portion of the last column of the interleaving matrix, and blocks of redundancy bits at a tail portion of the subsequence are placed into elements at both end portions of the first column of the interleaving matrix and both end portions of the last column of the interleaving matrix.

This scenario is applicable to the case where both the head of the first OFDM symbol and the tail of the last OFDM symbol are subject to interference.

As can be further seen from FIG. 13, any two adjacent blocks of redundancy bits in the subsequence are placed in the first and the last column respectively or are placed into two spaced apart blocks of elements in one of the first and the last column. In this manner, the sparsity of the mapping of redundancy bits to the first and last symbols is maximized.

Note that the second embodiment described above is also applicable when no systematic bits are placed into elements at the central portion of the first and/or the last OFDM symbol. In that case, blocks of redundancy bits at a head portion of the subsequence can be placed into blocks of elements at the central portion of the first column of the interleaving matrix and/or the central portion of the last column of the interleaving matrix, and blocks of redundancy bits at a tail portion of the subsequence can be placed into blocks of elements at both end portions of the first column of the interleaving matrix and/or both end portions of the last column of the interleaving matrix.

According to a third embodiment, two blocks of redundancy bits separated by k/2−1 blocks can be placed into two adjacent blocks of elements in the first and/or the last column, wherein k is the number of blocks in the subsequence. As such, if blocks of deinterleaved bits are consecutively punctured at the reception side, the distance of any two adjacent blocks of punctured bits is maximized. For certain codes, decoding performance may benefit from the maximized distance.

Figure 14:
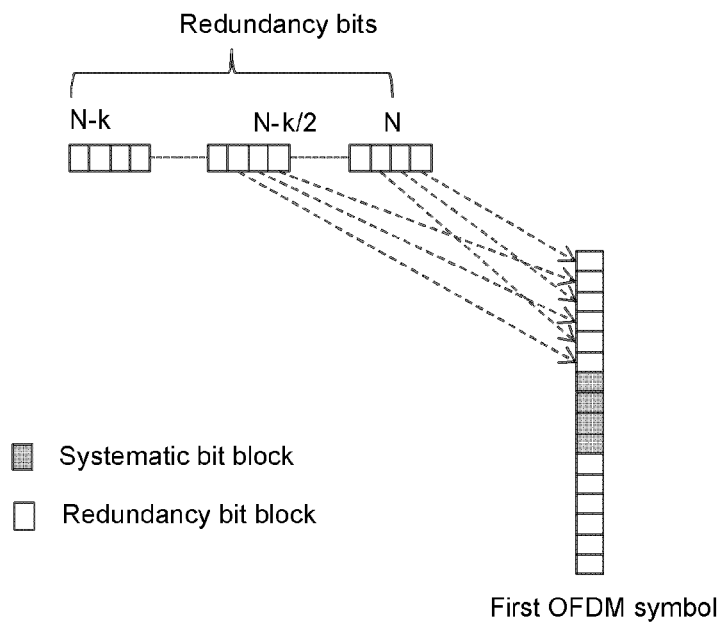
FIG. 14 is a diagram illustrating an interleaving manner for mapping redundancy bits to the first OFDM symbol of a radio subframe according to a third embodiment of the present disclosure.

FIG. 14 illustrates a scenario of the embodiment, which is applicable to the case where only the head of the first OFDM symbol is subject to interference. As will be appreciated by those skilled in the art, the third embodiment is also applicable to the cases where only the tail of the last OFDM symbol is subject to interference and where both the head of the first OFDM symbol and the tail of the last OFDM symbol are subject to interference.

The specific interleaving scheme to be applied may be pre-defined by specification in a technical standard. In a case where the transmitting terminal device is a cellular terminal device, the interleaving scheme may be configured by the network, and notified to the transmitting terminal device via Radio Resource Control (RRC) signaling.

In a case where the transmitting terminal device is a D2D terminal device, the interleaving scheme may be configured by the network, and notified to the transmitting D2D terminal device via control information sent from the network to the D2D terminal device. Alternatively, the interleaving scheme may be configured by a cluster head among a plurality of D2D terminal devices, and notified to the transmitting D2D terminal device via a beacon broadcast from the cluster head to the plurality of D2D terminal devices. The interleaving scheme may also be autonomously selected by the transmitting D2D terminal device, and notified to the receiving D2D terminal device via control information or beacon sent from the transmitting D2D terminal device.

Correspondingly, at the reception side, the interfered OFDM symbol and/or its interfered part and possibly the puncturing pattern of the bits may be pre-defined, or may be notified to the receiving device by the network, the cluster head or the transmitting terminal device. In such a case, the block S502 in the above-described method 500 is unnecessary.

As an enhancement of the above-described method 500, an amount of interference leaking to all bits in the radio subframe which correspond to the interfered OFDM symbol(s) can be calculated. Based on the calculated amount of interference, the interference leaking to all the bits corresponding to the interfered OFDM symbol(s) is suppressed, for example, by scaling the bits and/or their logarithmic likelihood ratio (LLR) accordingly.

In this manner, the leakage of interference to all the bits corresponding to the interfered OFDM symbol(s) caused by the windowing operation performed in frequency domain for selecting resource blocks allocated to the transmitting terminal device is fully taken into account and handled properly. As a result, the possibility of successful demodulating and decoding the radio subframe can be further increased.

As an alternative to the above-described method 400, the method performed in a terminal device for communicating with an RBS or a D2D terminal device may comprise forming a radio subframe by including redundancy bits in at least a head of a first symbol of the radio subframe or in at least a tail of a last symbol of the radio subframe, or both. The method may also comprise transmitting the radio subframe to the RBS or the D2D terminal device.

As an alternative to the above-described method 500, the method preformed in a communication device for communicating with a cellular terminal device or a D2D terminal device may comprise receiving a radio subframe from the cellular terminal device or the D2D terminal device. The method may further comprise demodulating and decoding the radio subframe, wherein said demodulating and decoding comprises decoding the radio subframe using redundancy bits carried in at least a head of a first symbol of the radio subframe or in at least a tail of a last symbol of the radio subframe, or both.

Correspondingly to the above-described methods 400 and 500, a terminal device and a communication device may be provided. The terminal device comprises means adapted to form a radio subframe by including coded bits in the radio subframe and to transmit the radio subframe to the RBS or the D2D terminal device. The coded bits contain a sequence of systematic bits and a sequence of redundancy bits. Only redundancy bits are included in a head and a tail of the first and/or the last OFDM symbols of the radio subframe.

The communication device comprises means adapted to receive a radio subframe from the cellular terminal device or the D2D terminal device and to puncture bits in the radio subframe which correspond to the head and the tail of at least one of the first and the last OFDM symbols, wherein the at least one of the first and last OFDM symbols is subject to interference. The radio subframe carries redundancy bits in a head and a tail of the first and/or the last OFDM symbols of the radio subframe.

As set forth above, the terminal device may be a cellular terminal device participating in cellular communications or a D2D terminal device participating in D2D communications. Correspondingly, the communication device may be an RBS or a D2D terminal device.

In the following, functional architectures of a terminal device 1500 and a communication device 1600 according to an example of the present disclosure will be given with reference to FIGS. 15 and 16, respectively.

Figure 15:
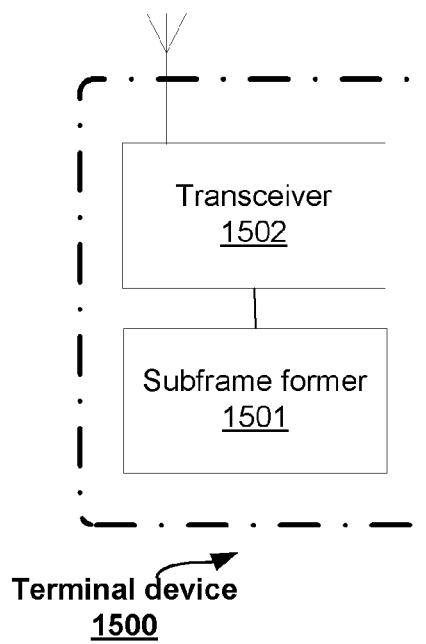
FIG. 15 is a block diagram illustrating a functional architecture of a terminal device at the transmission side according to an example of the present disclosure.

As shown in FIG. 15, the terminal device 1500 comprises a subframe former 1501 and a transceiver 1502. The subframe former 1501 is configured to form a radio subframe by including coded bits in the radio subframe. The coded bits contain a sequence of systematic bits and a sequence of redundancy bits. Only redundancy bits are included in a head and a tail of the first and/or the last OFDM symbols of the radio subframe. The transceiver 1502 is configured to transmit the radio subframe to an RBS or a D2D terminal device.

In an embodiment, the subframe former 1501 may be configured to include systematic bits in a central portion of the first and/or the last OFDM symbol, if systematic bits are to be included in the first and/or the last OFDM symbol.

In an embodiment, the redundancy bits included in the head and the tail of the first and/or the last OFDM symbols may belong to a subsequence of the sequence of redundancy bits.

In an embodiment, the subframe former 1501 may be configured to place the coded bits by blocks into an interleaving matrix, with each block of the coded bits corresponding to a modulated symbol. The coded bits in each column of the interleaving matrix are included in a respective OFDM symbol of the radio subframe.

In an embodiment, the subframe former 1501 may be configured to place blocks of redundancy bits at a head portion of the subsequence into blocks of elements at a bottom end portion of the first column of the interleaving matrix and/or a top end portion of the last column of the interleaving matrix, and to place blocks of redundancy bits at a tail portion of the subsequence into blocks of elements at a top end portion of the first column of the interleaving matrix and/or a bottom end portion of the last column of the interleaving matrix.

In an embodiment, the subframe former 1501 may be configured to place any two adjacent blocks of redundancy bits in the subsequence in the first and the last column respectively, if the redundancy bits are placed into elements at both end portions of the first and the last columns.

In an embodiment, in a case where systematic bits are included in a central portion of the first and/or last OFDM symbol, the subframe former 1501 may be configured to place blocks of redundancy bits at a head portion of the subsequence into blocks of elements in a neighborhood of the central portion of the first column of the interleaving matrix and/or a neighborhood of the central portion of the last column of the interleaving matrix, and to place blocks of redundancy bits at a tail portion of the subsequence into elements at both end portions of the first column of the interleaving matrix and/or both end portions of the last column of the interleaving matrix.

In a case where there is no systematic bits included in the first and/or last OFDM symbol, the subframe former 1501 may be configured to place blocks of redundancy bits at a head portion of the subsequence into blocks of elements at the central portion of the first column of the interleaving matrix and/or the central portion of the last column of the interleaving matrix, and to place blocks of redundancy bits at a tail portion of the subsequence into blocks of elements at both end portions of the first column of the interleaving matrix and/or both end portions of the last column of the interleaving matrix.

In an embodiment, the subframe former 1501 may be configured to place any two adjacent blocks of redundancy bits in the subsequence in the first and the last column respectively or into two spaced apart blocks of elements in one of the first and the last column, if the redundancy bits are placed into elements at both end portions of the first and the last columns.

In an embodiment, the subframe former 1501 may be configured to place two blocks of redundancy bits separated by k/2−1 blocks of redundancy bits into two adjacent blocks of elements in the first and/or the last column, wherein k is the number of blocks of redundancy bits in the subsequence.

In light of the above-described functional architecture of the terminal device 1500, those skilled in the art can conceive various implementations, wherein the functional blocks of the terminal device 1500 may be implemented in hardware, software, and/or firmware.

As an exemplary implementation, the above-described subframe former and transceiver may be implemented separately as suitable dedicated circuits. Nevertheless, they can also be implemented using any number of dedicated circuits through functional combination or separation. In one embodiment, the subframe former and the transceiver may be combined in a single application specific integrated circuit (ASIC).

Figure 17:
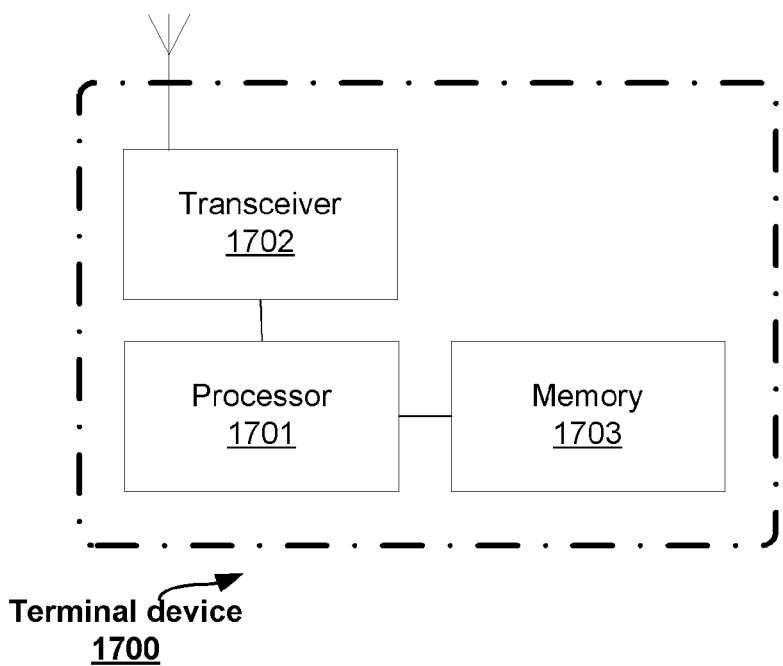
FIG. 17 is a block diagram illustrating an exemplary hardware implementation of the terminal device according to the present disclosure.

As an alternative implementation, there may be provided a terminal device 1700 comprising a processor 1701 (including but not limited to a microprocessor, a microcontroller or a Digital Signal Processor (DSP), etc.), a transceiver 1702 and a memory 1703, as illustrated in FIG. 17. The memory 1703 stores machine-readable program code executable by the processor 1701 to perform the function of the above-described subframe former. The transceiver 1702 transmits radio subframes formed by the processor 1701 to an RBS or a D2D terminal device.

Figure 16:
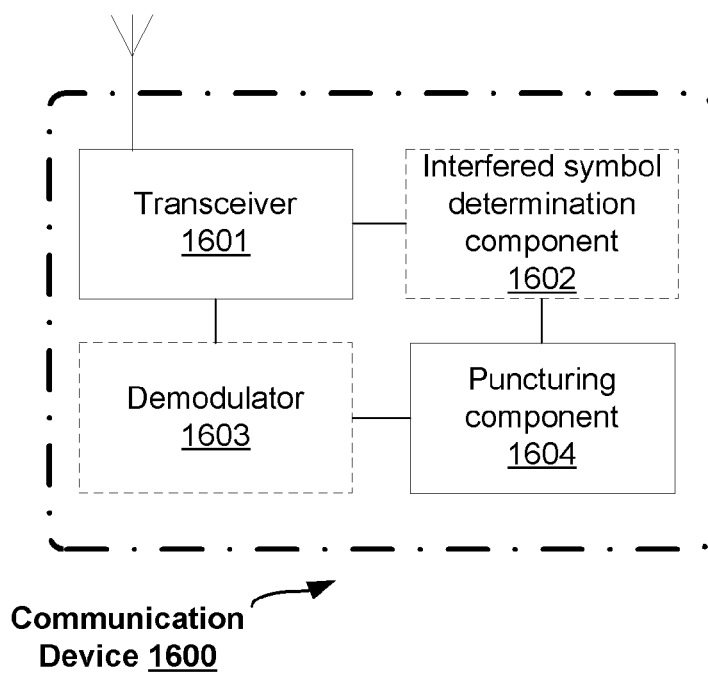
FIG. 16 is a block diagram illustrating a functional architecture of a communication device at the reception side according to an example of the present disclosure.

Turing back to FIG. 16, the communication device 1600 comprises a transceiver 1601 and a puncturing component 1604. The transceiver 1601 is configured to receive a radio subframe from a cellular terminal device or a D2D terminal device. The radio subframe carries redundancy bits in a head and a tail of the first and/or the last OFDM symbols of the radio subframe. The puncturing component 1604 is configured to puncture bits in the radio subframe which correspond to the head and the tail of at least one of the first and the last OFDM symbols, wherein the at least one of the first and the last OFDM symbols is subject to interference.

The communication device 1600 may further comprises a demodulator 1603, which is configured to demodulate the radio subframe to obtain a sequence of demodulated bits. Accordingly, the puncturing component 1604 may be configured to puncture some of the demodulated bits which correspond to the head and the tail of the at least one of the first and the last OFDM symbols.

Optionally, the communication device 1600 may further comprise an interfered symbol determination component (1602), which is configured to determine which of the first and the last OFDM symbols of the radio subframe is/are subject to interference.

In an embodiment, the interfered symbol determination component 1602 may be configured to determine a length of an interfered part of the interfered OFDM symbol(s). The puncturing component 1604 may be configured to puncture bits in the radio subframe which correspond to the interfered part of the interfered OFDM symbol(s).

In an embodiment, the communication device 1600 may further comprise an interference calculator and an interference suppressor. The interference calculator may be configured to calculate an amount of interference leaking to all bits in the radio subframe which correspond to the interfered OFDM symbol(s). The interference is caused by a windowing operation performed in frequency domain for selecting resource blocks allocated to the cellular terminal device or the D2D terminal device. The interference suppressor may be configured to, based on the calculated amount of interference, suppress the interference leaking to all the bits corresponding to the interfered OFDM symbol(s).

Likewise, in light of the above-described functional architecture of the communication device 1600, those skilled in the art can conceive various implementations, wherein the functional blocks of the communication device 1600 may be implemented in hardware, software, and/or firmware.

As an exemplary implementation, the above-described transceiver, interfered symbol determination component, demodulator, puncturing component, interference calculator and interference suppressor may be implemented separately as suitable dedicated circuits. Nevertheless, they can also be implemented using any number of dedicated circuits through functional combination or separation. In one embodiment, all of them may be combined in a single application specific integrated circuit (ASIC).

Figure 18:
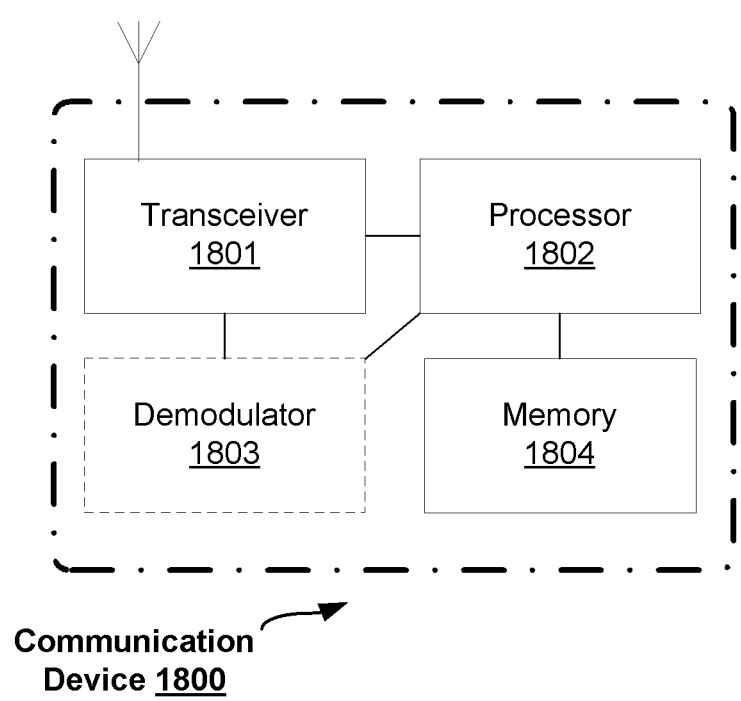
FIG. 18 is a block diagram illustrating an exemplary hardware implementation of the communication device according to the present disclosure.

As an alternative implementation, there may be provided a communication device 1800 comprising a transceiver 1801, a processor 1802 (including but not limited to a microprocessor, a microcontroller or a Digital Signal Processor (DSP), etc.) and a memory 1804, as illustrated in FIG. 18. The transceiver 1801 receives a radio subframe from the cellular terminal device or the D2D terminal device, wherein the radio subframe carries redundancy bits in a head and a tail of the first and/or the last OFDM symbols of the radio subframe. The memory 1804 stores machine-readable program code executable by the processor 1802 to perform the functions of the above-described interfered symbol determination component, puncturing component, interference calculator and interference suppressor.

The communication device 1600 may further comprises a demodulator 1603, which is configured to demodulate the radio subframe to obtain a sequence of demodulated bits. Accordingly, the processor 1802 may puncture some of the demodulated bits which correspond to the head and the tail of the at least one of the first and the last OFDM symbols.

Again, it shall be noted that the term "terminal device" as used herein should be understood to encompass not only end-user wireless devices but also end-application wireless devices.

The present disclosure is described above with reference to the embodiments thereof. However, those embodiments are provided just for illustrative purpose, rather than limiting the present disclosure. The scope of the disclosure is defined by the attached claims as well as equivalents thereof. Those skilled in the art can make various alternations and modifications without departing from the scope of the disclosure, which all fall into the scope of the disclosure.

What is claimed is:

1. A method performed in a terminal device for communicating with a radio base station (RBS) or a Device-to-Device (D2D) terminal device in an Orthogonal Frequency Division Multiplexing (OFDM) based radio communication network, comprising:
    forming a radio subframe by including coded bits in the radio subframe, wherein the coded bits contain a sequence of systematic bits and a sequence of redundancy bits, and only redundancy bits are included in a head and a tail of the first and/or the last OFDM symbols of the radio subframe; and
    transmitting the radio subframe to the RBS or the D2D terminal device.

2. The method of claim 1, wherein
    if systematic bits are to be included in the first and/or last OFDM symbol, the systematic bits are included in a central portion of the first and/or the last OFDM symbol.

3. The method of claim 1, wherein the redundancy bits included in the head and the tail of the first and/or the last OFDM symbols belong to a subsequence of the sequence of redundancy bits.

4. The method of claim 1, wherein
    the coded bits are placed by blocks into an interleaving matrix, with each block of the coded bits corresponding to a modulated symbol, and
    the coded bits in each column of the interleaving matrix are included in a respective OFDM symbol of the radio subframe.

5. The method of claim 4, wherein
blocks of redundancy bits at a head portion of the subsequence are placed into blocks of elements at a bottom end portion of the first column of the interleaving matrix and/or a top end portion of the last column of the interleaving matrix, and
blocks of redundancy bits at a tail portion of the subsequence are placed into blocks of elements at a top end portion of the first column of the interleaving matrix and/or a bottom end portion of the last column of the interleaving matrix.

6. The method of claim 4, wherein
if systematic bits are included in a central portion of the first and/or last OFDM symbol,
blocks of redundancy bits at a head portion of the subsequence are placed into blocks of elements in a neighborhood of the central portion of the first column of the interleaving matrix and/or a neighborhood of the central portion of the last column of the interleaving matrix, and
blocks of redundancy bits at a tail portion of the subsequence are placed into elements at both end portions of the first column of the interleaving matrix and/or both end portions of the last column of the interleaving matrix.

7. The method of claim 4, wherein
if there is no systematic bits included in the first and/or last OFDM symbol,
blocks of redundancy bits at a head portion of the subsequence are placed into blocks of elements at the central portion of the first column of the interleaving matrix and/or the central portion of the last column of the interleaving matrix, and
blocks of redundancy bits at a tail portion of the subsequence are placed into blocks of elements at both end portions of the first column of the interleaving matrix and/or both end portions of the last column of the interleaving matrix.

8. The method of claim 5, wherein
any two adjacent blocks of redundancy bits in the subsequence are placed in the first and the last column respectively, if the redundancy bits are placed into elements at both end portions of the first and the last columns.

9. The method of claim 6, wherein
any two adjacent blocks of redundancy bits in the subsequence are placed in the first and the last column respectively or are placed into two spaced apart blocks of elements in one of the first and the last column, if the redundancy bits are placed into elements at both end portions of the first and the last columns.

10. The method of claim 4, wherein
two blocks of redundancy bits separated by k/2−1 blocks of redundancy bits are placed into two adjacent blocks of elements in the first and/or the last column, wherein k is the number of blocks of redundancy bits in the subsequence.

11. The method of claim 1, wherein the terminal device is a cellular terminal device or a Device-to-Device (D2D) terminal device.

12. A terminal device, in an Orthogonal Frequency Division Multiplexing (OFDM) based radio communication network, comprising:
a transceiver; and
one or more processors coupled to the transceiver, the one or more processors configured to:
form a radio subframe by including coded bits in the radio subframe, wherein the coded bits contain a sequence of systematic bits and a sequence of redundancy bits, and only redundancy bits are included in a head and a tail of the first and/or the last OFDM symbols of the radio subframe; and
transmit the radio subframe to a radio base station (RBS) or a Device-to-Device (D2D) terminal device.

13. The terminal device of claim 12, wherein
if systematic bits are to be included in the first and/or last OFDM symbol, the one or more processors are configured to include systematic bits in a central portion of the first and/or the last OFDM symbol.

14. The terminal device of claim 12, wherein the redundancy bits included in the head and the tail of the first and/or the last OFDM symbols belong to a subsequence of the sequence of redundancy bits.

15. The terminal device of claim 12, wherein the one or more processors are further configured to
place the coded bits by blocks into an interleaving matrix, with each block of the coded bits corresponding to a modulated symbol, and
include the coded bits in each column of the interleaving matrix in a respective OFDM symbol of the radio subframe.

16. The terminal device of claim 15, wherein the one or more processors are further configured to:
place blocks of redundancy bits at a head portion of the subsequence into blocks of elements at a bottom end portion of the first column of the interleaving matrix and/or a top end portion of the last column of the interleaving matrix, and
place blocks of redundancy bits at a tail portion of the subsequence into blocks of elements at a top end portion of the first column of the interleaving matrix and/or a bottom end portion of the last column of the interleaving matrix.

17. The terminal device of claim 15, wherein if systematic bits are included in a central portion of the first and/or last OFDM symbol, the one or more processors are further configured to:
place blocks of redundancy bits at a head portion of the subsequence into blocks of elements in a neighborhood of the central portion of the first column of the interleaving matrix and/or a neighborhood of the central portion of the last column of the interleaving matrix, and
place blocks of redundancy bits at a tail portion of the subsequence into elements at both end portions of the first column of the interleaving matrix and/or both end portions of the last column of the interleaving matrix.

18. The terminal device of claim 15, wherein if there is no systematic bits included in the first and/or last OFDM symbol, the one or more processors are further configured to:
place blocks of redundancy bits at a head portion of the subsequence into blocks of elements at the central portion of the first column of the interleaving matrix and/or the central portion of the last column of the interleaving matrix, and
place blocks of redundancy bits at a tail portion of the subsequence into blocks of elements at both end portions of the first column of the interleaving matrix and/or both end portions of the last column of the interleaving matrix.

19. The terminal device of claim 16, wherein the one or more processors are further configured to:

place any two adjacent blocks of redundancy bits in the subsequence in the first and the last column respectively, if the redundancy bits are placed into elements at both end portions of the first and the last columns.

20. The terminal device of claim 17, wherein the one or more processors are further configured to:

place any two adjacent blocks of redundancy bits in the subsequence in the first and the last column respectively or into two spaced apart blocks of elements in one of the first and the last column, if the redundancy bits are placed into elements at both end portions of the first and the last columns.

21. The terminal device of claim 15, wherein the one or more processors are further configured to:

place two blocks of redundancy bits separated by $k/2-1$ blocks of redundancy bits into two adjacent blocks of elements in the first and/or the last column, wherein k is the number of blocks of redundancy bits in the subsequence.

22. The terminal device of claim 12, wherein the terminal device is a cellular terminal device or a Device-to-Device (D2D) terminal device.

* * * * *